(12) United States Patent
Yamaguchi

(10) Patent No.: US 8,742,966 B2
(45) Date of Patent: Jun. 3, 2014

(54) OUTPUT DEVICE

(71) Applicant: Kawasaki Microelectronics, Inc., Chiba (JP)

(72) Inventor: Masato Yamaguchi, Naha (JP)

(73) Assignee: MegaChips Corporation, Osaka-shi (JP)

( * ) Notice: Subject to any disclaimer, the term of this patent is extended or adjusted under 35 U.S.C. 154(b) by 0 days.

(21) Appl. No.: 13/781,081

(22) Filed: Feb. 28, 2013

(65) Prior Publication Data
US 2013/0222166 A1 Aug. 29, 2013

(30) Foreign Application Priority Data
Feb. 28, 2012 (JP) ................... 2012-041199

(51) Int. Cl.
| | |
|---|---|
| H03M 1/66 | (2006.01) |
| H03M 1/74 | (2006.01) |
| G09G 5/393 | (2006.01) |
| G09G 3/36 | (2006.01) |
| G09G 3/20 | (2006.01) |
| H03K 19/003 | (2006.01) |
| H03K 19/0185 | (2006.01) |

(52) U.S. Cl.
CPC ............... *H03M 1/747* (2013.01); *G09G 5/393* (2013.01); *G09G 3/3688* (2013.01); *G09G 3/20* (2013.01); *G09G 2330/021* (2013.01); *G03G/3648* (2013.01); *H03K 19/00361* (2013.01); *H03K 19/018521* (2013.01); *H03K 19/00315* (2013.01)

USPC .............................................. 341/144; 345/98

(58) Field of Classification Search
CPC ..... H03M 1/747; G09G 5/393; G09G 3/3688; G09G 3/20; G09G 2330/021; G09G 3/3648; H03K 19/00361; H03K 19/00315; H03K 19/018521
USPC ........ 341/144; 345/545, 204, 87, 98, 55, 212, 345/24, 211, 99; 327/108, 333, 112
See application file for complete search history.

(56) References Cited

U.S. PATENT DOCUMENTS 7,332,930 B2   2/2008   Mitsuishi
7,643,000 B2 *  1/2010   Cho ................................ 345/98

FOREIGN PATENT DOCUMENTS

JP    A-2005-318264    11/2005

* cited by examiner

*Primary Examiner* — Joseph Lauture
(74) *Attorney, Agent, or Firm* — Oblon, Spivak, McClelland, Maier & Neustadt, L.L.P.

(57) ABSTRACT

An output device receives a data signal, outputs an output signal corresponding to the data signal in synchronization with a clock signal, and includes a driving unit configured to drive an output buffer that outputs the output signal. The driving unit includes a signal switching unit and first and second driving circuits that operate with the same power supply. The signal switching unit inputs the clock signal into one of the first and second driving circuits in accordance with the level of the data signal, and the one of the first and second driving circuits outputs a driving signal whose level varies in accordance with a change in the level of the clock signal to the output buffer.

9 Claims, 7 Drawing Sheets

OUTPUT DEVICE

This application claims priority from Japanese Patent Application No. 2012-041199, filed on Feb. 28, 2012, which is hereby incorporated by reference in its entirety.

BACKGROUND

This disclosure relates to an output device that outputs a data signal in synchronization with a clock signal.

An example of an output device that outputs a data signal in synchronization with a clock signal is the one having the configuration illustrated in FIG. 8. An output device 120 illustrated in FIG. 8 includes an output buffer 124 and a driving unit 122 that drives the output buffer 124. The driving unit 122 includes a flip-flop 126 and driving circuits that shape a waveform of a driving signal supplied from the flip-flop 126 and output the signal. In the example shown in FIG. 8, inverters 128A and 128B are used as the driving circuits.

Although not illustrated, the output buffer 124 operates using a power supply that supplies an upper-limit output voltage and a lower-limit output voltage. While the driving unit 122 operates using a power supply different from that used by the output buffer 124. That is, the flip-flop 126 and the driving circuits 128A and 128B in the driving unit 122 operate with the same power supply.

As illustrated in FIG. 9, a data signal is sampled and held in the flip-flop 126 in the driving unit 122 in synchronization with a rise of the clock signal and output to a node A. The data signal output to the node A is inverted by the driving circuits 128A and 128B, and the inverted signals are output as driving signals. The driving signal is input into gate of each of a PMOS (P-channel metal-oxide semiconductor (MOS) transistor) 130A and an NMOS (n-channel MOS transistor) 130B.

When the data signal is H level, the data signal output from the flip-flop 126 is H. The H level is inverted to L level by the driving circuits 128A and 128B, and the PMOS 130A is turned on and the NMOS 130B is turned off in the output buffer 124. Accordingly, the output terminal is connected to the upper-limit output voltage, and the output signal level becomes H. In contrast, when the data signal is L, the output signal is connected to the lower-limit output voltage, and the level becomes L.

As illustrated in the timing chart in FIG. 9, an amount of current flows from the power supply to the driving unit varies dependent on whether the level of the data signal changes. The amount also depends on whether the data signal makes a L-to-H transition or a H-to-L transition.

In the example illustrated in FIG. 9, the current consumed by the driving unit has peaks at the rising edges of the clock signal. Specifically, the current has the largest peak when the data signal output to the node A changes from L to H, the second largest peak when the data signal output to the node A changes from H to L, and the smallest peak when the data signal does not change.

In this way, the amount of current consumed by the driving unit 122 varies dependent on the level of the data signal output to the node A. Accordingly, different amounts of noises, or fluctuations in the voltage, of the power supply are generated dependent on the data signal output to the node A. As a result, jitter, or timing fluctuation, in the output signal increases. This is a serious problem in particular for example when a plurality of output devices 120 operates using the same power supply.

In an output device 132 illustrated in FIG. 10, the voltage of the power supply used by the driving unit 122 and that used by the output buffer 124 are different. Accordingly, level shifters (L/S) 134A and 134B are added before the flip-flop 126 in the output device 120 illustrated in FIG. 8. In the output device 132, voltage levels of the data signal and that of the clock signal are shifted by the level shifters 134A and 134B such that the voltage levels of the data and clock signals match with the voltage of the power supply used by the output buffer 124.

When the voltage of the power supply used by the output buffer 124 is higher than that of the driving unit 122, because the flip-flop 126 and the driving circuits 128A and 128B operate at the voltage of the power supply used by the output buffer 124, the current consumption may increase. As a result, the power-supply noise may increase, and jitter in the output voltage signal may be larger than that in the output device 120 illustrated in FIG. 8.

One example of the prior art for solving the problem of power supply noise described above is illustrated in Japanese Unexamined Patent Application Publication No. 2005-318264 (patent literature). As illustrated in FIG. 11, an output device 146 illustrated in this patent literature includes a cancel data generating circuit 148, a dummy output buffer 150A, and an output buffer 150B.

As illustrated in the timing chart in FIG. 12, a data signal changes in synchronization with a clock signal in the output device 146, and the data signal is output from the output buffer 150B. The cancel data generating circuit 148 generates a cancel data signal that changes in synchronization with rising edges of the clock signal when the data signal does not change, and the cancel data signal is output from the dummy output buffer 150A.

As illustrated in the timing chart in FIG. 12, a current flows in the output buffer 150B when the data signal changes in synchronization with the rising edge of the clock signal. The same amount of current flows in the dummy output buffer 150A when the cancel data signal changes, i.e., when the data signal does not change, in synchronization with the rising edge of the clock signal. Accordingly, the output device 146 as a whole consumes the same current in synchronization with every rising edge of the clock signal.

That is, in the output device 146 described in the above-mentioned patent literature, the cancel data generating circuit enables to consume, at the rising edges of the clock signal when the data signal does not change, the same amount of current as the amount current consumed when the data signal changes. Thereby, it is achieved that the amounts of current consumed by the output device as a whole does not depend on whether the data signal changes or does not change. This technique can reduce the jitter in the output voltage signal.

However, this technique increases the circuit scale because the cancel data generating circuit 148 and the dummy output buffer 150A are necessary. In addition, noises in the power supply that the cancel data generating circuit 148 generates may be a problem.

SUMMARY

Accordingly, it is an exemplary object of this invention to provide an output device that can reduce jitter in an output signal without increasing a circuit scale and a current consumption.

The exemplary output device generates power-supply noises of substantially the same magnitude at every edge of a clock signal. Accordingly, an occurrence of jitter in an output signal can be reduced. In addition, because circuitry such as a cancel data generating circuit and a dummy output buffer are not necessary, a circuit scale and a current consumption current are small. Accordingly, the exemplary output device has is an advantage in the low cost and the low power-supply noise.

Further, the exemplary output device prevent the occurrence of jitter in an output signal even when a plurality of output devices that output different data signals operate with the same power supply. Accordingly, the exemplary output device may be advantageously utilized to construct various circuit units such as a digital-to-analog (D/A) converter.

Various exemplary embodiments according to this disclosure provide a output device including an output buffer including a first buffer switch connected between a first supply voltage and an output terminal that outputs an output signal and a second buffer switch connected between the output terminal and a second supply voltage.

A driving unit receives a clocks signal and a data signal and drives the output buffer in synchronization with the clock signal.

The driving unit includes a first and a second driving circuit that operate with the same power supply, the first and second driving circuit drive the first and second buffer switches, respectively.

A signal switching device selects one of the first and second driving circuits in accordance with a logical level of the data signal and supplies a selection signal to the selected one of the driving circuits, the selection signal having a selection signal level that changes in synchronization with a change of a logical level of the clock signal.

The selected one of the first and second driving circuits outputs a driving signal having a driving signal level that changes in synchronization with the logical level of the clock signal to a corresponding one of the first and second buffer switches.

DESCRIPTION OP THE PREFERRED EMBODIMENTS

Exemplary output devices according to this disclosure are described in detail below with reference to accompanying drawings.

Figure 1:
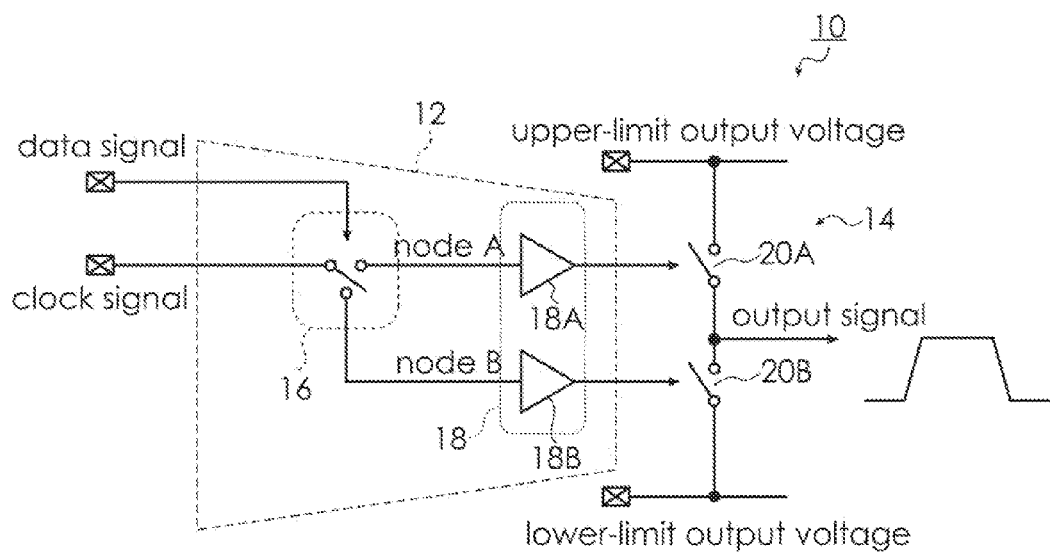
FIG. 1 is a conceptual diagram that illustrates a schematic configuration of an output device according to an embodiment of the present invention.

FIG. 1 is a conceptual diagram that illustrates a schematic configuration of an output device according to an exemplary embodiment of this disclosure. The output device 10 illustrated in FIG. 1 receives a data signal and outputs a voltage signal (output signal) corresponding to the data signal in synchronization with a clock signal. The output device 10 includes a driving unit 12 and an output buffer 14.

Although not illustrated, the output buffer 14 operates using a power supply that supplies an upper-limit output voltage and a lower-limit output voltage. The driving unit 12 operates using a power supply different from that used by the output buffer 14.

The driving unit 12 drives the output buffer 14. The output buffer 14 includes a first switch 20A and a second switch 20B, and outputs the voltage signal.

The driving unit 12 includes a signal switching device 16 and a driving circuit 18 that outputs driving signals for driving the output buffer 14. The signal switching device 16 and the driving circuit 18 operate with the same power supply. It is noted, however, that the signal switching device 16 and driving circuit 18 may operate with different power supplies. The driving circuit 18 includes a first driving circuit 18A that outputs a first driving signal and a second driving circuit 18B that outputs a second driving signal.

The signal switching device 16 makes switching in accordance with a level of a data signal and functions to input a clock signal into one of the first and second driving circuits 18A and 18B. That is, the signal switching device 16 outputs the clock signal to one of the driving circuits 18A and 18B to make the one of the driving circuits in the active state. The signal switching device 16 outputs, to the other one of the driving circuits 18A and 18B, a signal that makes the other one of the driving circuits outputs a driving signal in an inactive state.

That is, the other one of the driving circuit 18A and 18B outputs a signal that makes corresponding one of the switches 20A and 20B in the output buffer 14 off.

For example, when a data signal is in logical H level, the clock signal is input to the first driving circuit 18A through a node A of the signal switching device 16, whereas a logical L level signal is input to the second driving circuit 18B through a node B. In this case, the clock signal is output from the first driving circuit 18A as a first driving signal, and the L signal is output from the second driving circuit 18B as a second driving signal.

When the data signal is L, the clock signal is input to the second driving circuit 18B through the node B of the signal switching device 16, whereas a L signal is input to the first driving circuit 18A through the node A. In this case, the L signal is output from the first driving circuit 18A as the first driving signal, and the clock signal is output from the second driving circuit 18B as the second driving signal.

That is one of the first and second driving circuits 18A and 18B outputs a driving signal whose level varies in accordance with a level of the clock signal to the output buffer 14 as one of the first and second driving signals. The other one of the driving circuits outputs L signal to the output buffer 14.

The signal switching device 16 can be constructed by, for example, a switch, demultiplexer, Gilbert cell, or a voltage multiplier.

The output buffer 14 includes a first switch 20A and a second switch 20B. The first switch 20A, which is driven by the first driving signal, is disposed between an output terminal of the output buffer 14 that outputs the output signal and a first power supply that supplies the upper-limit output voltage. The second switch 20B, which is driven by the second driving signal, is disposed between the output terminal of the output buffer 14 and a second power supply that supplies the lower-limit output voltage. The first and second switches 20A and 20B are driven such that they are not turned on at the same time, so that the upper-limit output voltage and the lower-limit output voltage are not connected with each other.

When the signal switching device 16 supplies the clock signal to the first driving circuit, the first driving signal is H or L depending on the level of the clock signal. When the first driving signal is H, the first switch 20A is turned on and connects the output terminal of the output device 10 to the upper-limit output voltage. On the other hand, the second driving signal is kept in L level, and the second switch 20B is kept off.

When the signal switching device 16 supplies the clock signal to the second driving circuit, the second driving signal is E or L depending on the level of the clock signal. When the second driving signal is H, the second switch 20B is turned on and connects the output terminal of the output device 10 to the lower-limit output voltage. On the other hand, the first driving signal is kept in L level, and the first switch 20A is kept off.

That is, the signal switching device 16 supplies the clock signal to a selected one of the first and second driving circuit 18A and 18B, and supplies a fixed level signal to the other one of the first and second driving circuits. Accordingly, the selected one of the driving circuit outputs a driving signal that changes between H and L levels and the corresponding one of the switches 20A and 20B in the output buffer 14 is turned on and off. The other one of the driving circuits outputs a signal to keep the corresponding one of the switches off.

Figure 2:
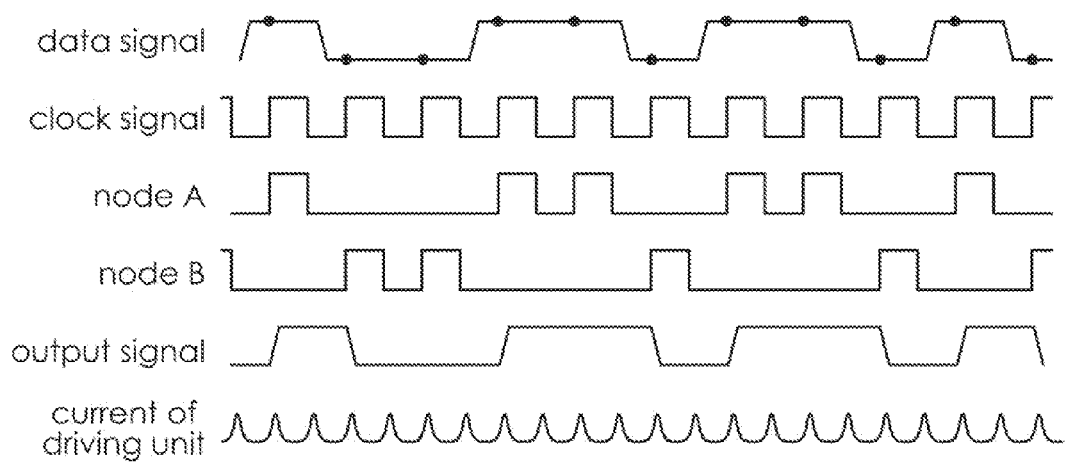
FIG. 2 is a timing chart that illustrates an example of operation of the output device illustrated in FIG. 1.

As illustrated in the timing chart in FIG. 2, when a data signal is H, a clock signal is output to the node A, and a L signal is output to the node B. That is, the clock signal is the first driving signal, and the L signal is the second driving signal. Accordingly, the first switch 20A in the output buffer 14 is turned on or off in accordance with the level of the clock signal whereas the second switch 20B is kept off.

When the clock signal becomes H, the first switch 20A is turned on and the output terminal of the output device 10 is connected to the upper-limit output voltage, and the output signal changes to L. Thereafter, the first switch 20A is turned off when the clock signal becomes L. However, the output signal keeps H level while the data signal is H, because the second switch 20B is kept off.

On the other hand, when the data signal is L, the clock signal is output to the node B, and the L signal is output to the node A. That is, the clock signal is the second driving signal, and the L signal is the first driving signal. Accordingly, the second switch 20B in the output buffer 14 is turned on or off in accordance with the level of the clock signal, whereas the first switch 20A is kept off.

When the clock signal becomes H, the second switch 20B is turned on and the output terminal of the output device 10 is connected to the lower-limit output voltage, and the output signal changes to L. Thereafter, the second switch 20B is turned off when the clock signal changes to L. However, the output signal keeps L level while the data signal is L, because the first switch 20A is kept off.

Incidentally, when the first and second, switches 20A and 20B are turned off, the output signal node is floating. However, in this embodiment, one of the switches turned on in synchronization with the clock signal. Thus, it is not necessary to provide a circuit for holding the potential of the node.

A total current flowing from the power supply to the driving unit 12 is the sum of the current required to change the level of the first driving signal, which flows at every rising and falling edge of the clock signal when the data signal is H, and the current required to change the level of the second driving signal, which flows at every rising and falling edge when the data signal is low. Thus, as illustrated in the timing chart in FIG. 2, the current flows in the driving unit 12 at every rising and falling edge of the clock signal.

It is possible to design the first and second driving circuit 18A and 18B such that the amount of current that flows when the clock signal changes from L to H and the amount of current that flows when the clock signal changes from H to L are substantially the same. Nonetheless, as can be seen from FIG. 1, the level of the output signal does not change in synchronization with falling edges of the clock signal. Accordingly, it is acceptable that the amount of current that flows when the clock signal changes from L to H and the amount of current that flows when the clock signal changes from H to L are different with each other.

Accordingly, it is possible to reduce the variation in the levels of power-supply noises dependent on the data signal by generating substantially the same magnitude of power-supply noise in synchronization with every rising and felling edge of the clock signal. As a result, the jitter in the output voltage signal can be reduced.

The output device 10 does not have to include circuitry such as the cancel data generating circuit and a dummy output buffer that are required in the above-described patent literature. Accordingly, the circuit scale and the current consumption are small. Therefore, the exemplary output device is advantageous in the low cost and reduced power-supply noise.

As described above, the jitter in the output voltage signal can be decreased in the output device 10. Accordingly, it is acceptable to operate a plurality of output devices that output different data signals in synchronization with the clock signal with the same power supply. For example, in a digital-to-analog (D/A) converter that includes a plurality of output devices, interferences between the output devices that share the power supply can be suppressed, and degradation in an output signal can be avoided.

A specific example of the configuration of the exemplary output device 10 is described below.

Figure 3:
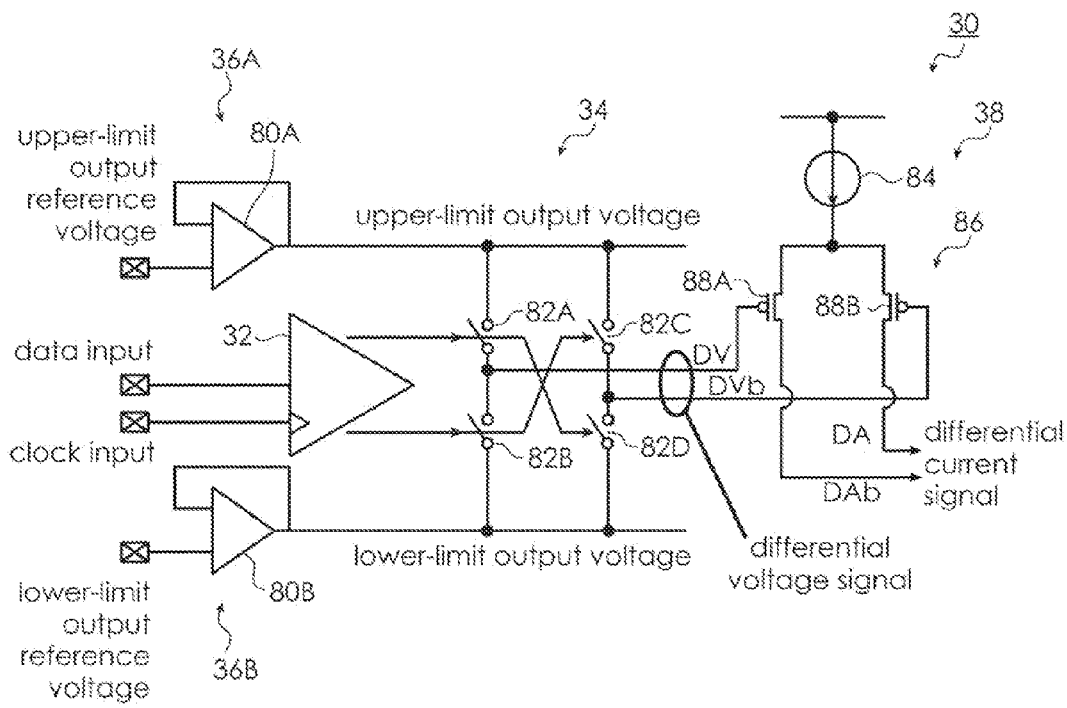
FIG. 3 is a circuit diagram that illustrates a specific configuration of the output device according to an embodiment of the present invention.

FIG. 3 is a circuit diagram that illustrates a specific exemplary configuration of an exemplary output device according to this disclosure. The output device 30 illustrated in FIG. 3 receives a data signal and outputs a differential voltage signal (output signal) corresponding to the data signal in synchronization with a clock signal. The output device 30 further converts the differential voltage signal to a differential current signal. The output device 30 includes a driving unit 32, an output buffer 34, an upper-limit output voltage generating unit 36A, a lower-limit output voltage generating unit 36B, and a voltage-to-current converting unit 38.

Figure 4:
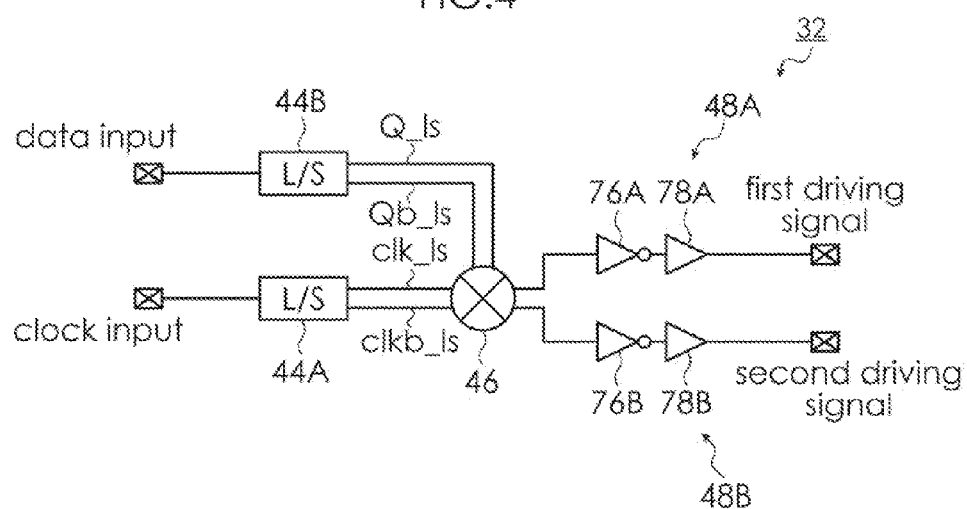
FIG. 4 is a circuit diagram that illustrates an example of the configuration of a driving unit.

The driving unit 32 corresponds to the driving unit 12 illustrated in FIG. 1 and includes first and second level shifters (L/Ss) 44A and 44B, a Gilbert cell 46, and first and second driving circuits 48A and 48B, as illustrated in FIG. 4.

The first and second level shifters 44A and 44B shift the voltage level of the clock signal and that of the data signal, respectively, such that the voltage level matches with the voltage of the power supply used by the output buffer 34. In the exemplary driving unit 32, a 3.3 V power supply dedicated for analog circuitry is used for the operation of the output buffer 34.

In the example illustrated in FIG. 4, level shifters 44A and 44B shift the level of the input signals and output differential signals. That is, when the logic level of the input signal is H (1.2 V), the output signal clk_ls of the first level shifter 44A and the output signal Q_ls of the second level shifter 44B are H (3.3 V), and the output signal clk_ls of the first level shifter 44A and the output signal Qb_ls of the second level shifter 44B are L (0 V). By contrast, when the logic level of the input signal is L (0 V), the output signals clk_ls and Q_ls are L (0 V), and the output signals clkb_ls and Qb_ls are H (3.3 V).

Figure 5:
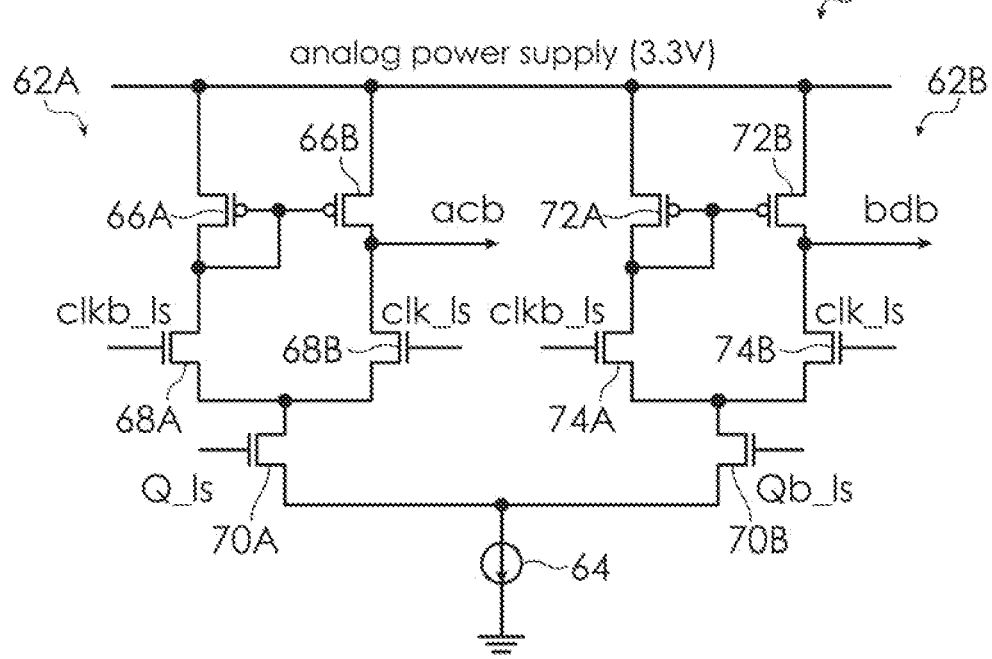
FIG. 5 is a circuit diagram that illustrates an example of the configuration of a Gilbert cell.

The Gilbert cell 46 operates with the dedicated analog power supply of 3.3 V. It performs voltage multiplication on the differential clock signals clk_ls and clkb_ls supplied from the first level shifter 44A and the differential data signals Q_ls and Qb_ls supplied from the second level shifter 44B, and outputs the resultant signals acb and bdb. As illustrated in FIG. 5, the Gilbert cell 46 includes differential amplifiers 62A and 62B, a current source 64, and a pair of NMOSs 70A and 70B, which operate as switches to supply the current generated by the current source 64 to one of the differential amplifiers 62A and 62B.

The differential amplifier 62A includes MMOSs 68A and 68B forming a differential pair and PMOS 66A and 66B forming a current mirror circuit. The source of each of the PMOSs 66A and 668 is connected to the dedicated analog power supply, the gate thereof is connected to the drain of the PMOS 66A, and a signal acb is output from the drain of the PMOS 66B. The NMOS 68A is connected between the drain of the PMOS 66A and the drain of the NMOS 70A. The NMOS 68B is connected between the drain of the PMOS 66B and the drain of the NMOS 70A. The clock signal clk_ls is input into the gate of the NMOS 68B. The inverted clock signal clkb_ls, which is the inverted signal (inverted polarity signal) of the clock signal clk_ls, is input into the gate of the NMOS 68A. The data signal Q_ls is input into the gate of the NMOS 70A.

Similarly, the differential amplifier 628 includes NMOSs 74A and 74B forming a differential pair and PMOSs 72A and 72B forming a current mirror circuit. The differential amplifier 62B has substantially the same configuration as in the differential amplifier 62A, except that the inverted data signal Qb_ls, which is the inverted signal of the data signal Q_ls, is input into the gate of the NMOS 70B. A signal bdb is output from the drain of the PMOS 72B.

The current source 64 is connected between the source of each of the NMOSs 70A and 70B and the ground.

In the Gilbert cell 46, when the data signal Q_ls is H and the data signal Qb_ls is L, the NMOS 70A is turned on, and the differential amplifier 62A becomes active. At this time, when the clock signal clk_ls is H and the clock signal clkb_ls is L, the NMOS 68B is turned on and the NMOS 68A turns off, and the output signal acb becomes L. By contrast, when the clock signal clk_ls is L and the clock signal clkb_ls is H, the output signal acb becomes H. On the other hand, the differential amplifier 62B is inactive, and the output signal bdb is H.

In contrast, when the data signal Q_ls is L and the data signal Qb_ls is H, the NMOS 70B is turned on, and the differential amplifier 62B becomes active and operates in substantially the same manner as in the case where the differential amplifier 62A becomes active. That is, when the clock signal clk_ls is H and the clock signal clkb_ls is L, the output signal bdb becomes L. When the clock signal clk_ls is L and the clock signal clkb_ls is H, the output signal bdb becomes H. On the other hand, the differential amplifier 62A is inactive, and the output signal acb is H.

That is, the Gilbert cell 46 selects one of the differential amplifiers 62A and 62B. The selected one of the differential amplifiers outputs a selection signal acb or bdb having a logical level that changes in synchronization with the change of the level of the clock signal, and the other one of the differential amplifiers outputs and output signal having a fixed logical level.

In this exemplary Gilbert cell shown in FIG. 5, the logical level of the selection signal acb or bdb is opposite to the level of the clock signal. Nonetheless, the selection signal output from the Gilbert cell 46, which has a logical level that changes in synchronization with the change of the level of the clock signal, can be used to synchronize the operation of following blocks with the clock signal. In this sense, the selection signal can be used as a clock signal.

The Gilbert cell 46 operates symmetrically. That is, one of the differential amplifiers 62A and 62B becomes active in accordance with the level of data signal Q_ls and Qb_ls, and one of the NMOSs 68A and 68B or 74A and 74B is turned on at every rising and falling edge of the clock signal clk_ls and clk_ls. Accordingly, the Gilbert cell 46 draw the same current from the dedicated analog power supply at every rising and falling edge of the clock signal, as schematically shown on the bottom of FIG. 2.

The first and second driving circuits 48A and 48B operate with the dedicated analog power supply of 3.3 V. They shape the waveform of the output signal acb and that of the output signal bdb from the Gilbert cell 46, respectively, and output them as first and second driving signals, respectively.

The first driving circuit 48A includes an inverter 76A and a buffer 78A. Similarly, the second driving circuit 48B includes an inverter 76B and a buffer 78B.

When the data signal supplied from the driving unit 32 is H, the first driving circuit 48A outputs a first driving signal having a logical level that changes in synchronization with the change of the logical level of the clock signal and the second driving circuit 48B outputs a L signal as the second driving signal. By contrast, when the data signal is L, the second driving circuit 48B outputs a second driving signal having a logical level that changes in synchronization with the change of the logical level of the clock signal, and the L signal is output as the first driving signal.

The Gilbert cell 46 supplies the selection signal having a logical level that changes in synchronization with the change of the logical level of the clock signal to one of the first and second driving circuits 48A and 48B. Accordingly, it is possible to make a total current consumed by the driving circuits 48A and 48B at every rising edge of the clock signal the same.

The upper-limit output voltage generating unit 36A includes an amplifier 80A and generates the upper-limit output voltage. The lower-limit output voltage generating unit 36B includes an amplifier 80B and generates the lower-limit output voltage, as illustrated in FIG. 3.

The amplifier 80A in the upper-limit output voltage generating unit 36A includes a non-inverting input terminal that receives an upper-limit output reference voltage and an inverting input terminal that receives an output signal of the amplifier 80A itself.

Similarly, the amplifier 80B in the lower-limit output voltage generating unit 36B includes a non-Inverting input terminal that receives a low-limit output reference voltage and an inverting input terminal that receives an output signal of the amplifier 80B itself.

The output buffer 34 includes first to fourth switches 82A, 828, 82C, and 82D, as illustrated in FIG. 3.

The first and second switches 82A and 82B are connected in series between the upper-limit output voltage and the lower-limit output voltage. Similarly, the third and fourth switches 82C and 82D are connected in series between the upper-limit output voltage and lower-limit output voltage. The first driving signal output from the driving unit 32 is input into the first and fourth switches 82A and 82D, and the second driving signal is input into the second and third switches 82B and 82C. A differential voltage signal DV is output from the node between the first and second switches 82A and 82B. A differential voltage signal DVb is output from the node between the third and fourth switches 82C and 82D.

When the first and second driving signals are H and L, respectively, the first and fourth switches 82A and 82D are turned on, the second and third switches 82B and 82C are turned off. Accordingly, the differential voltage signals DV and DVb are H and L, respectively. By contrast, when the first and second driving signals are L and H, respectively, the first and fourth switches 82A and 82D are turned off, the second and third switches 82B and 82C are turned on. Accordingly, the differential voltage signals DV and DVb are L and H, respectively.

The voltage-to-current converting unit 38 converts the differential voltage signals DV and DVb output from the output buffer 34 into differential current signals DA and DAb, respectively. The voltage-to-current converting unit 38 includes a current source 84 and a differential pair of transistors PMOSs 88A and 88B. The current source 84 is connected between the power supply and the source of each of the PMOSs 88A and 88B of the pair of differentials 86. The differential voltage signals DV and DVb output from the output buffer 34 are input into the gate of the PMOS 88A and that of the PMOS 88B, respectively, and the differential current signals DA and DAb are output from their respective drains.

When the differential voltage signals DV and DVb are H and L, respectively, the PMOSs 88A and 88B are turned off and on, respectively. Accordingly, a current supplied from the current source 84 flows through the PMOS 88B as a differential current signal DA. By contrast, when the differential voltage signals DV and DVb are L and H, respectively, the current flows through the PMOS 88A as a differential current signal DAb.

That is, in the output device 30, when the data signal is H, the differential voltage signals DV and DVb are H and L, respectively, and the current supplied from the current source 84 flows through the PMOS 88B as a differential current signal DA. By contrast, when the data signal is L, the differential voltage signals DV and DVb are L and H, respectively, and the current flows through the PMOS 88A as a differential current signal DAb.

In the output device 30, the differential voltage signals DV and DVb are output from the output buffer 34, and the differential current signals DA and DAb are output from the voltage-to-current converting unit 38. As in this example, the output device can output a voltage signal or a current signal as its output signal.

The output buffer 34 allows the current to pass therethrough in accordance with the level of the clock signal, and power-supply noise occurring when the level of the clock signal changes from L to H and that when it changes from H to L are of substantially the same magnitude. That is, when Thus, the occurrence of jitter in the differential output signals DA and DAb can be reduced.

In place of the upper-limit output voltage and lower-limit output voltage, an B-side current source and a L-side current source may be provided, and the output buffer 34 may output a current. As for the data signal, a current signal may be input in place of the voltage signal.

The first and second level shifters 44A and 44B may be unnecessary depending on the relationship between the voltage level of the data signal and the voltage of the power supply used by the output buffer 34. When the level shifters are necessary, they may have any positional relationship with the signal switching device. That is, they may be disposed after the signal switching device 46.

An exemplary application of the output device 30 is described below.

Figure 6:
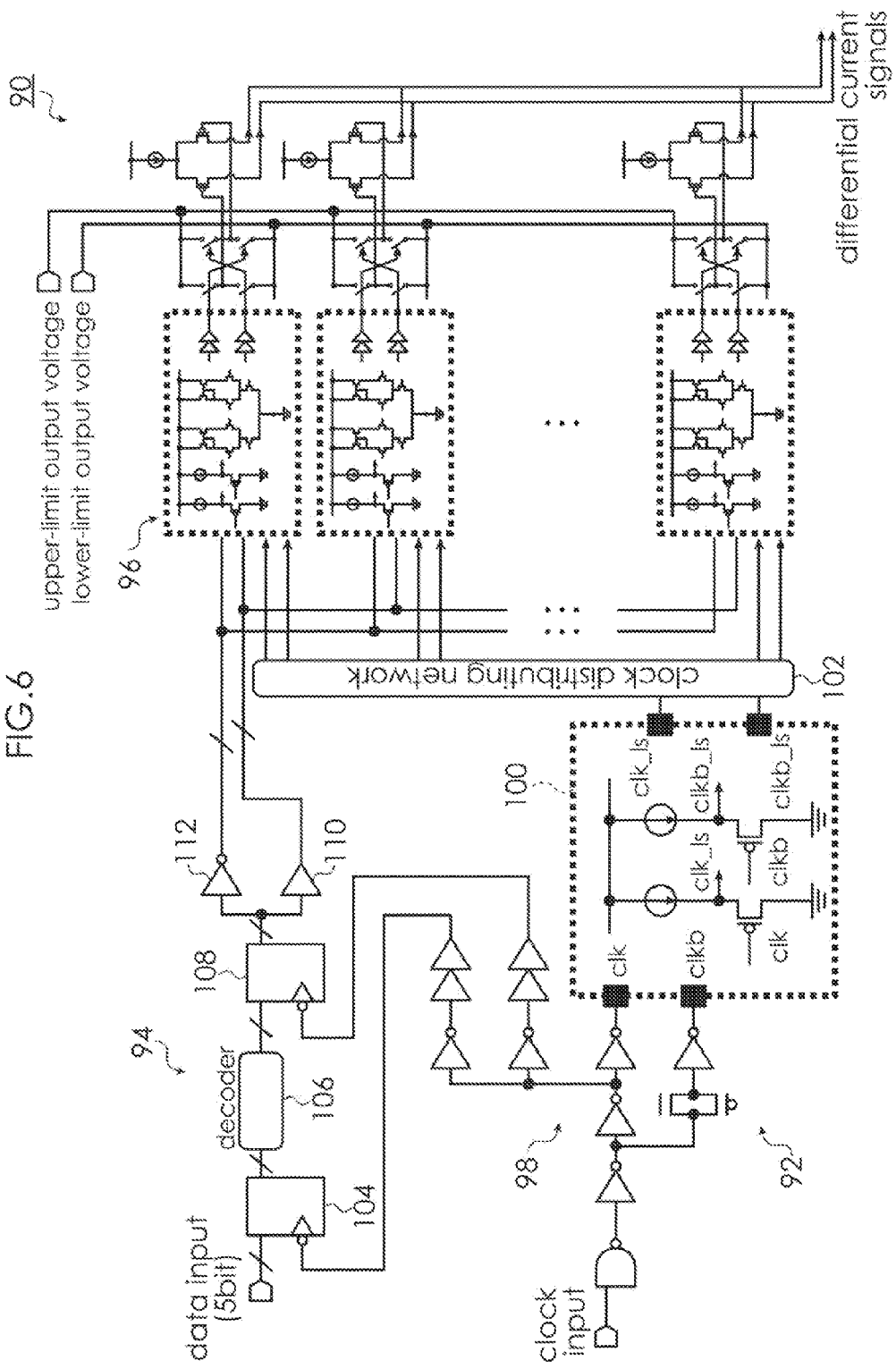
FIG. 6 is a circuit diagram that illustrates the configuration of a D/A converter to which output devices according to an embodiment of the present invention are applied.

FIG. 6 is a circuit diagram that illustrates a configuration of an exemplary digital-to-analog (D/A) converter to which the output devices according to an embodiment of this disclosure are applied. The exemplary D/A converter 90 illustrated in FIG. 6 decodes a 5-bit data signal in synchronization with a clock signal, and outputs differential current signals corresponding to the data signal. The D/A converter 90 includes a clock distributing unit 92, a data decoding unit 94, and a plurality of output devices 96 according to the present invention.

The clock distributing unit 92 distributes a clock signal to a plurality of portions that is to use the clock signal. The clock distributing unit 92 includes a clock buffer 98, a clock level shifter 100, and a clock distribution network 102.

The clock buffer 98 generates a clock signal and its inverted signal that are to be used in the clock level shifter 100 of the clock distributing unit 92 and in data decoding unit 94.

The clock level shifter 100 shifts the voltage level of the clock signal and its inverted signal supplied from the clock buffer 98 to, for example, the dedicated analog voltage 3.3 V used in the output device 96.

The clock distribution network 102 supplies the clock signal and its inverted signal supplied from the clock level shifter 100, to all of the output devices 96.

The data decoding unit 94 decodes the 5-bit data signal, and generates 32-bit thermometer code. The date decoding unit 94 includes flip-flops 104 and 108, a decoder 106, a buffer 110, and an inverter 112.

In the data decoding unit 94, the 5-bit digital code is held in the former flip-flop 104 in synchronization with the clock signal supplied from the clock buffer 98, it is decoded by the decoder 106, the 32-bit thermometer code corresponding to the 5-bit digital code is generated, and it is held in the latter flip-flop 108 in synchronization with the clock signal. The 32-bit thermometer code output from the latter flip-flop 108 is shaped by each of the buffer 110 and inverter 112, and the thermometer code and its inverted signal are output.

Each of the output devices 96 corresponds to the output device 30 illustrated in FIG. 3, except that it does not include the first and second level shifters 44A and 44B. That is, the D/A converter 90 includes the plurality of output buffers 34 and driving units 32 in the plurality of output devices 96. The plurality of driving units 32 including the first and second driving circuits operate with the same power supply.

Figure 7:
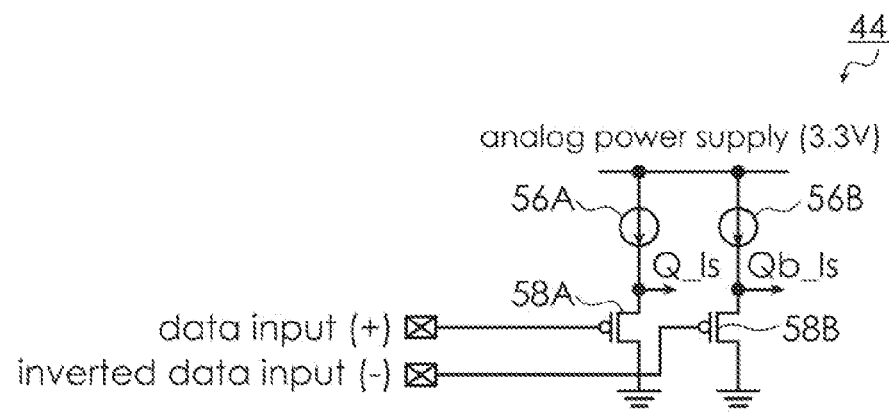
FIG. 7 is a circuit diagram that illustrates another example of the configuration of a level shifter for a data signal.
Figure 8:
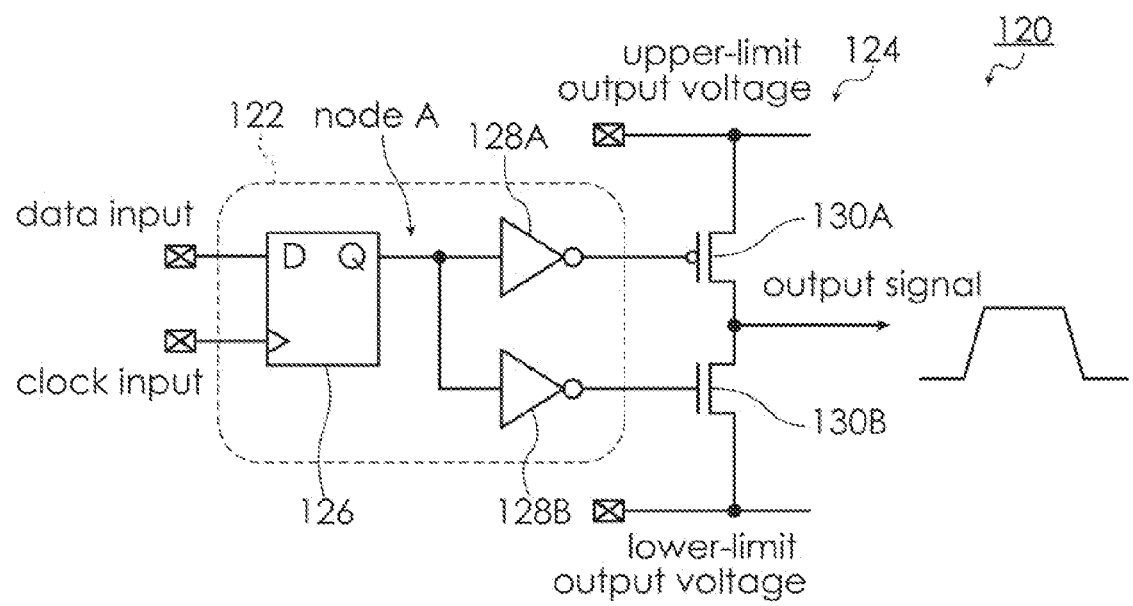
FIG. 8 is a circuit diagram that illustrates an example of the configuration of a known output device.
Figure 9:
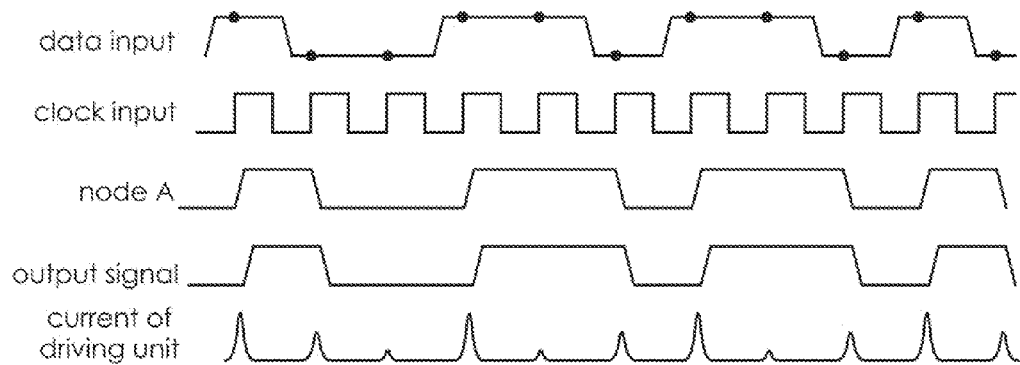
FIG. 9 is a timing chart that illustrates an example of operation of the output device illustrated in FIG. 8.
Figure 10:
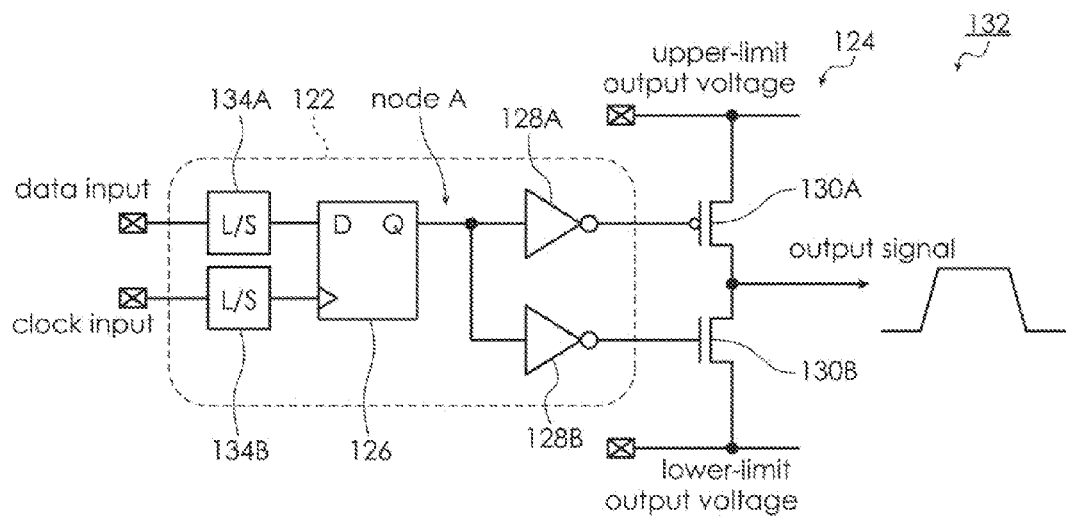
FIG. 10 is a circuit diagram that illustrates an example of the configuration of another known output device.
Figure 11:
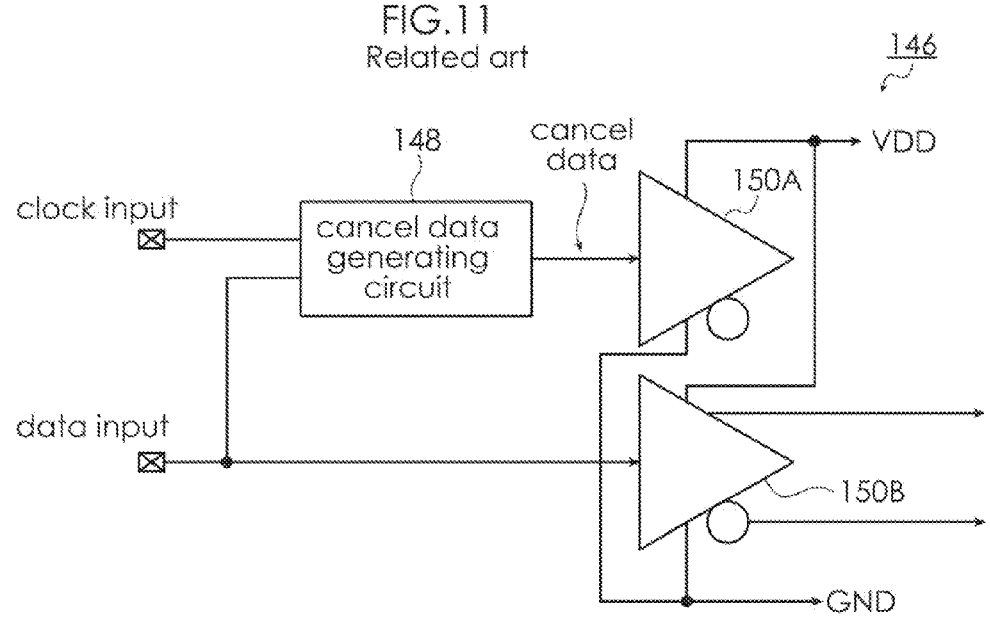
FIG. 11 is a circuit diagram that illustrates an example of the configuration of an output device described in patent literature.
Figure 12:
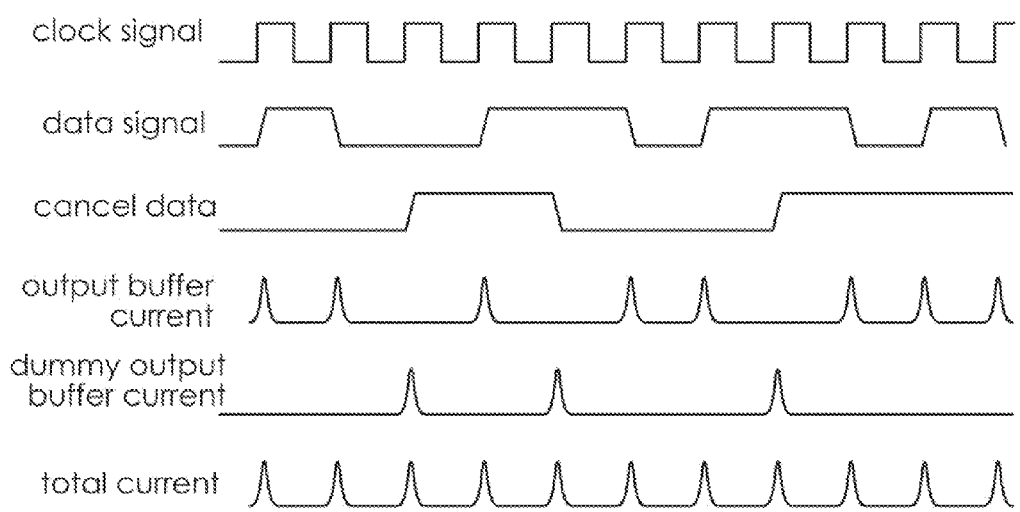
FIG. 12 is a timing chart that illustrates an example of operation of the output device illustrated in FIG. 11.

In each of the output devices 96, the clock signal and its inverted signal supplied from the clock level shifter 100 are directly input into the gate of each of the NMOSs 68A and 68B and the gate of each of the NMOSs 74A and 74B in the Gilbert cell 46 illustrated in FIG. 5. In the output device 96, as illustrated in FIG. 7, the data signal and its inverted signal supplied from the data decoding unit 94 are directly input into the second level shifter 44B.

In the D/A converter 90, the clock signal is distributed by the clock distributing unit 92, and the 32-bit thermometer code corresponding to the 5-bit data signal is generated by the data decoding unit 94. A current corresponding to each bit of the 32-bit thermometer code supplied from the data decoding unit 94 is output from each of the output devices 96 in synchronization with the clock signal supplied from the clock distributing unit 92. A differential current signal of the total of the currents, which corresponds to the 5-bit digital signal, output from all of the output devices 96 is output.

Because the driving units 32 in the plurality of output devices 96 operate with the same power supply, the driving unit may interfere with each other and mounts of jitters in the outputs from the driving units 32 may be increased. If this is the case, the output currents from the plurality of output devices 96 cannot be synchronized accurately. As a result, the output current of the D/A converter may temporarily change to an erroneous value during the change of the 5-bit digital signal.

The exemplary D/A converter 90 can advantageously utilize the exemplary output device that can decrease the jitter in the output signal even when the same power supply is used to operate a plurality of output devices. That is, it is possible to prevent the D/A converter 90 output erroneous values even if the same power supply is used to operate a plurality of output devices.

The exemplary output device 96 is also applicable to various circuits that output a data signal in synchronization with a clock signal, in addition to the D/A converter described in this example.

A circuit configuration included in the output device of the present invention, such as the signal switching unit and driving circuit in the driving unit, the output buffer, the voltage-to-current converting unit, and other elements, is not limited, and various circuit configurations performing substantially the same functions can also be used. The output device can output a data signal in synchronization with at least either one of a rise and a fall of a clock signal.

The basics of the present invention are described above. The present invention is described in detail above. The present invention is not limited to the above-described embodiments, and various modifications and changes can be made within a range that does not depart from the spirit of the present invention.

What is claimed is:

1. A output device, comprising:
an output buffer including a first buffer switch connected between a first supply voltage and an output terminal that outputs an output signal and a second buffer switch connected between the output terminal and a second supply voltage;
a driving unit that receives a clock signal and a data signal and drives the output buffer in synchronization with the clock signal, the driving unit including:
a first and a second driving circuit that operate with the same power supply, the first and second driving circuit driving the first and second buffer switches, respectively; and
a signal, switching device that selects one of the first and second driving circuits in accordance with a logical level of the data signal and supplies a selection signal to the selected one of the driving circuits, the selection signal having a selection signal level that changes in synchronization with a change of a logical level of the clock signal,
wherein the selected one of the first and second driving circuits outputs a driving signal having a driving signal level that changes in synchronization with the logical level of the clock signal to a corresponding one of the first and second buffer switches.

2. The output device of claim 1, wherein:
the selected one of the first and second driving circuits output the driving signal having the driving signal level to the corresponding one of the first and second buffer switches, and the other one of the first and second driving circuits outputs a keeping signal having a fixed level that keeps the other one of the first and second buffer switches off to the other one of the buffer switches.

3. The output device of claim 2, wherein:
the signal switching device includes a pair of a differential amplifiers each receiving the clock signal and a inverted signal of the clock signal and a selection switch that selects one of the pair of differential amplifiers in accordance with the logical level of the data signal so that the selected one of the differential amplifiers outputs the selection signal.

4. A semiconductor integrated circuit comprising a plurality of the output devices of claim 1, wherein:
the first and second driving circuits in the plurality of output devices operate with the same power supply.

5. A semiconductor integrated circuit comprising a plurality of the output devices of claim 4, wherein:
in each of the plurality of output devices, the selected one of the first and second driving circuits output the driving signal having the driving signal level to the corresponding one of the first and second butler switches, and the other one of the first and second driving circuits outputs a keeping signal having a fixed level that keeps the other one of the first and second buffer switches off to the other one of the buffer switches.

6. A semiconductor integrated circuit comprising:
a plurality of output devices, each comprising,
an output buffer including a first buffer switch connected between a first supply voltage and an output terminal that outputs an output signal and a second buffer switch connected between the output terminal and a second supply voltage;
a driving unit that receives a clock signal and a data signal and drives the output buffer in synchronization with the clock signal, the driving unit including:
a first and a second driving circuit, the first and second driving circuit driving the first and second buffer switches, respectively; and
a signal switching device that selects one of the first and second driving circuits in accordance with a logical level of the data signal and supplies a selection signal to the selected one of the driving circuits, the selection signal having a selection signal level that changes in synchronization with a change of a logical level of the clock signal; and
a current generator that generates a fixed output current when the output signal has a first logical level;
wherein the selected one of the first and second driving circuits outputs a driving signal having a driving signal level that changes in synchronization with the logical level of the clock signal to a corresponding one of the first and second buffer switches; and
a summing circuit that sums the output current generated by each of the plurality of output devices to generate a summed output signal;
wherein the first and second driving circuits in the plurality of output devices operate with the same power supply.

7. The semiconductor integrated circuit of claim 6, wherein:
in each of the plurality of output devices, the selected one of the first and second driving circuits output the driving signal having the driving signal level to the corresponding one of the first and second buffer switches, and the other one of the first and second driving circuits outputs a keeping signal having a fixed level that keeps the other one of the first and second buffer switches off to the other one of the buffer switches.

8. A digital-to-analog converter comprising:

a plurality of output devices, each comprising,
- an output buffer including a first buffer switch connected between a first supply voltage and an output terminal that outputs an output signal and a second buffer switch connected between the output terminal and a second supply voltage;
- a driving unit that receives a clock signal and a data signal and drives the output buffer in synchronization with the clock signal, the driving unit including:
  - a first and a second driving circuit, the first and second driving circuit driving the first and second buffer switches, respectively;
  - a signal switching device that selects one of the first and second driving circuits in accordance with a logical level of the data signal and supplies a selection signal to the selected one of the driving circuits, the selection signal having a selection signal level that changes in synchronization with a change of a logical level of the clock signal; and
  - a current generator that generates a fixed output current when the output signal has a first logical level;
  - wherein the selected one of the first and second driving circuits outputs a driving signal having a driving signal level that changes in synchronization with the logical level of the clock signal to a corresponding one of the first and second buffer switches; and
- a decoder that receives a digital input signal and converts the digital input signal to the data signal to be supplied to each of the plurality of output devices; and
- a summing circuit that sums the output current generated by each of the plurality of output devices to generate an analog output signal corresponding to the input digital signal;

wherein the first and second driving circuits in the plurality of output devices operate with the same power supply.

9. The digital-to-analog converter of claim 8, wherein;

in each of the plurality of output devices, the selected one of the first and second driving circuits output the driving signal having the driving signal level to the corresponding one of the first and second buffer switches, and the other one of the first and second driving circuits outputs a keeping signal having a fixed level that keeps the other one of the first and second buffer switches off to the other one of the buffer switches.

* * * * *